United States Patent
Noishiki et al.

(10) Patent No.: US 8,920,020 B2
(45) Date of Patent: Dec. 30, 2014

(54) FLOW PASSAGE STRUCTURE

(75) Inventors: Koji Noishiki, Takasago (JP); Makoto Nishimura, Kobe (JP); Takeshi Yamashita, Kobe (JP); Tatsuo Yoshida, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 140 days.

(21) Appl. No.: 13/818,884

(22) PCT Filed: Sep. 13, 2011

(86) PCT No.: PCT/JP2011/005149
§ 371 (c)(1),
(2), (4) Date: Feb. 25, 2013

(87) PCT Pub. No.: WO2012/046389
PCT Pub. Date: Apr. 12, 2012

(65) Prior Publication Data
US 2013/0153071 A1    Jun. 20, 2013

(30) Foreign Application Priority Data
Oct. 4, 2010  (JP) ................... 2010-224659

(51) Int. Cl.
*B01F 5/06* (2006.01)
*B01F 5/00* (2006.01)
*B01J 19/00* (2006.01)
*B81B 1/00* (2006.01)
*B01L 3/00* (2006.01)

(52) U.S. Cl.
CPC . *B01F 5/00* (2013.01); *B01J 19/00* (2013.01); *B81B 1/00* (2013.01); *B01L 3/502746* (2013.01); *B01L 2300/0816* (2013.01); *B01L 2300/0867* (2013.01); *B01L 2300/0874* (2013.01); *B01L 2300/0887* (2013.01)
USPC ................... 366/340; 366/181.5; 366/336

(58) Field of Classification Search
USPC ............ 366/181.5, 336–338, 340–341
See application file for complete search history.

(56) References Cited

U.S. PATENT DOCUMENTS 6,305,834 B1 * 10/2001 Schubert et al. ............... 366/144
6,890,093 B2 *  5/2005 Karp et al. ..................... 366/336
(Continued)

FOREIGN PATENT DOCUMENTS

| JP | 2006-122735 | 5/2006 |
| JP | 2006 346671 | 12/2006 |

(Continued)

OTHER PUBLICATIONS

Japanese Office Action issued Sep. 17, 2013, in Japan Patent application No. 2010-224659 (with English translation).

(Continued)

*Primary Examiner* — Tony G Soohoo
*Assistant Examiner* — Abbas Rashid
(74) *Attorney, Agent, or Firm* — Oblon, Spivak, McClelland, Maier & Neustadt, L.L.P.

(57) ABSTRACT

A flow passage structure having a plurality of flow passageways therein includes a first junction portion for joining a first fluid introduced into a first inlet path and a second fluid introduced into a second inlet path, a first joined fluid flow passage through which a fluid made by joining both the fluids flows, a branch portion for dividing the fluid flowing in the first joined fluid flow passage into two fluids, a first branch path through which one of the two divided fluids flows, and a second branch path through which the other flows, wherein a corresponding diameter of the first branch path and a corresponding diameter of the second branch path in each of the passageways are smaller than a corresponding diameter of the first joined fluid flow passage in the passageway.

5 Claims, 6 Drawing Sheets

(56) References Cited

U.S. PATENT DOCUMENTS

| | | | |
|---|---|---|---|
| 7,708,950 B2 * | 5/2010 | Yamada et al. | 422/504 |
| 7,909,502 B2 * | 3/2011 | Ehrfeld et al. | 366/340 |
| 8,142,741 B2 | 3/2012 | Yoshida et al. | |
| 8,192,703 B2 | 6/2012 | Ban et al. | |
| 8,673,243 B2 * | 3/2014 | Noishiki et al. | 422/602 |
| 2003/0082079 A1 * | 5/2003 | Sawano | 422/100 |
| 2004/0265184 A1 * | 12/2004 | Matsuda et al. | 422/100 |
| 2006/0275184 A1 * | 12/2006 | Furukawa et al. | 422/129 |
| 2010/0178221 A1 * | 7/2010 | Yoshida et al. | 422/236 |
| 2011/0266498 A1 | 11/2011 | Noishiki et al. | |
| 2011/0268616 A1 | 11/2011 | Noishiki et al. | |
| 2012/0138176 A1 | 6/2012 | Noishiki et al. | |
| 2012/0234755 A1 | 9/2012 | Noishiki et al. | |

FOREIGN PATENT DOCUMENTS

| | | |
|---|---|---|
| JP | 2008 168173 | 7/2008 |
| JP | 2009 592 | 1/2009 |
| JP | 2009-592 | 1/2009 |
| JP | 2009 90164 | 4/2009 |
| JP | 2009-90164 | 4/2009 |
| JP | 2010-162428 | 7/2010 |

OTHER PUBLICATIONS

International Search Report Issued Dec. 20, 2011 in PCT/JP11/05149 Filed Sep. 13, 2011.

* cited by examiner

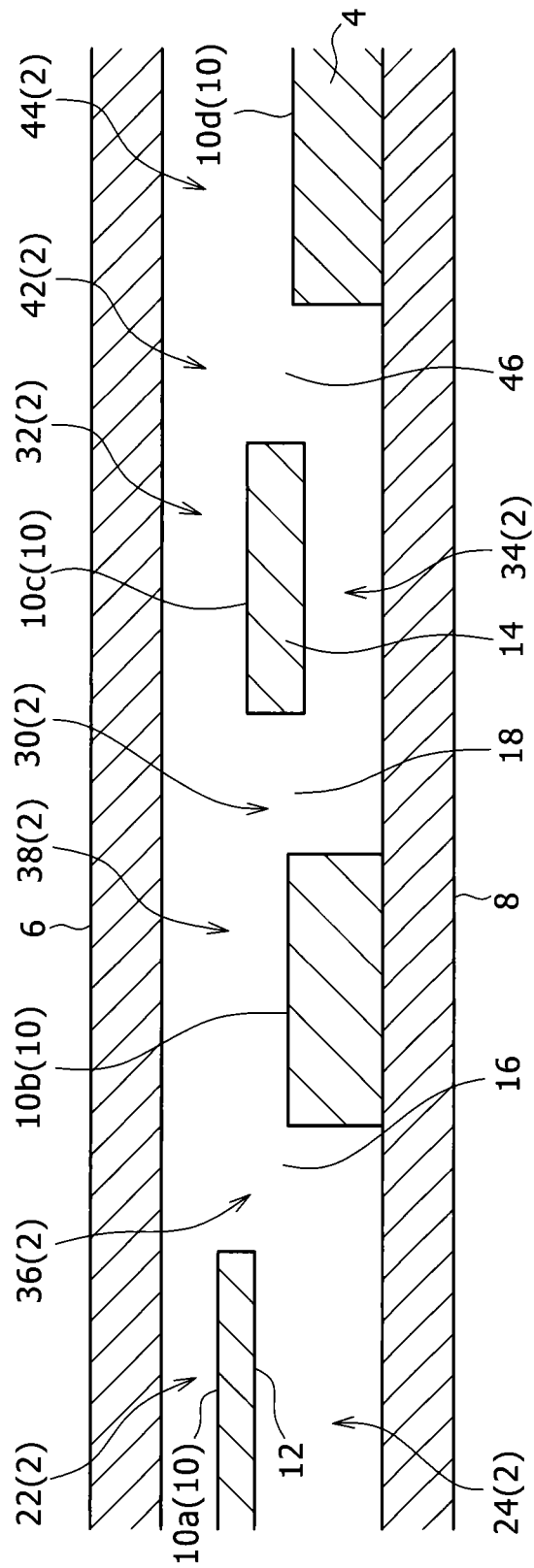

FLOW PASSAGE STRUCTURE

TECHNICAL FIELD

The present invention relates to a flow passage structure.

BACKGROUND ART

Conventionally, there is a known flow passage structure as a means for producing an interaction by mixing a plurality of fluids. The flow passage structure is used in a reactor for generating a chemical reaction between fluids as an interaction between a plurality of fluids of reacting agents, and thereby obtaining a desired reaction product. Patent Document 1 described below discloses one example in which a flow passage structure is used in a reactor.

Patent Document 1 discloses a reactor in which a flow passage structure having a plurality of flow passageways therein is used. Each of the flow passageways has a first inlet path into which a fluid of a first reacting agent is introduced, a second inlet path into which a fluid of a second reacting agent is introduced, a junction path connected to downstream parts of both the inlet paths for joining and mixing the fluids of the reacting agents flowing through the inlet paths, and a reaction path connected to a downstream part of the junction path for circulating a fluid made by joining the fluids in the junction path while reacting the reacting agents contained in the fluid. The first inlet path, the second inlet path, the junction path, and the reaction path in the flow passageway are arranged on one straight line.

The flow passage structure includes an intermediate substrate, a front substrate bonded to a front surface of the intermediate substrate, and a back substrate bonded to a back surface of the intermediate substrate. The plurality of passageways is arranged side by side in parallel to each other in the planar direction of the intermediate substrate. Front surface side groove portions extending linearly are formed on the front surface of the intermediate substrate. Back surface side groove portions are formed at positions on the back surface of the intermediate substrate, the positions corresponding to the front surface side groove portions, in parallel to the front surface side groove portions. Through holes penetrating the intermediate substrate in the thickness direction and being connected to terminal points of the back surface side groove portions are formed at positions on the intermediate substrate in the middle of the longitudinal direction of the front surface side groove portions. The first inlet paths and the reaction paths are formed by sealing openings of the front surface side groove portions formed on the front surface of the intermediate substrate with the front substrate. The second inlet paths are formed by sealing openings of the back surface side groove portions formed on the back surface of the intermediate substrate with the back substrate. The junction paths are formed by sealing one-side openings of the through holes formed on the front surface of the intermediate substrate with the front substrate and sealing the other-side openings of the through holes formed on the back surface of the intermediate substrate with the back substrate.

In the above reactor, the first inlet paths and the second inlet paths are arranged side by side in the thickness direction of the intermediate substrate forming the flow passage structure, and both the inlet paths are joined together in the thickness direction of the intermediate substrate. Thus, in comparison to a configuration that first inlet paths and second inlet paths are formed on the same surface of an intermediate substrate and both the inlet paths are joined together on the surface, the plurality of flow passageways can be more closely arranged in the planar direction of the intermediate substrate. As a result, even with the flow passage structure of the same size, more flow passageways can be provided in the flow passage structure. Therefore, in the above reactor, a treatment amount (reaction amount) of the fluids can be increased without increasing the size of the flow passage structure.

However, in the above configuration, when the fluid of the first reacting agent and the fluid of the second reacting agent are joined in the junction paths and then flow through the reaction paths, a reaction between the fluids is not easily facilitated. A reason thereof is as follows.

The reaction between both the fluids in the reaction paths is generated on a contact interface between the fluids. Thus, the more an area of the contact interface is increased, the more the reaction between the fluids is facilitated. However, in the above configuration, after an agitation state of the fluids following joining of the fluid of the first reacting agent and the fluid of the second reacting agent in the junction paths is settled down in the reaction paths, the area of the contact interface between both the fluids becomes substantially constant. Therefore, only a fixed amount of reactions in accordance with the area of the contact interface is generated.

CITATION LIST

Patent Document

Patent Document 1: Japanese Unexamined Patent Application Publication No. 2008-168173

SUMMARY OF INVENTION

An object of the present invention is to provide a flow passage structure capable of increasing a treatment amount by an interaction between two fluids and facilitating the interaction between the fluids after joining the two fluids without increasing size of the flow passage structure.

A flow passage structure according to one aspect of the present invention is a flow passage structure having a plurality of flow passageways therein, the flow passageways for circulating a first fluid and a second fluid in such a manner that the fluids are mixed with each other, including a substrate having a front surface and a back surface facing in the opposite direction to the front surface, a first sealing plate bonded to the front surface of the substrate, and a second sealing plate bonded to the back surface of the substrate, wherein on the front surface of the substrate, a plurality of first groove portions arranged so as to extend in a particular direction side by side in parallel to each other is formed, on the back surface of the substrate, a plurality of second groove portions arranged on the back side of the first groove portions so as to extend in parallel to the first groove portions, and a plurality of third groove portions arranged on the back side of the first groove portions so as to extend in parallel to the first groove portions, the third groove portions being spaced from the second groove portions in the longitudinal direction of the second groove portions are formed, in a part of the substrate where ends of the second groove portions on the side of the third groove portions are placed, a plurality of first hole portions penetrating the substrate from the front surface to the back surface, the first hole portions for causing the second groove portions to communicate with the first groove portions placed on the front side of the second groove portions is formed, in a part of the substrate where ends of the third groove portions on the side of the second groove portions are placed, a plurality of second hole portions penetrating the substrate from the front surface to the back surface, the second hole portions for causing the third groove portions to communicate with the first groove portions placed on the front side of the third groove portions is formed, the first sealing plate is bonded to the front surface of the substrate so as to seal openings of the first groove portions on the front surface side, the second sealing plate is bonded to the back surface of the substrate so as to seal openings of the second groove portions on the back surface side and openings of the third groove portions on the back surface side, each of the passageways includes a first inlet path into which the first fluid is introduced, the first inlet path being formed by a part of the first groove portion which is placed on the opposite side of the second hole portion with respect to the first hole portion, a second inlet path into which the second fluid is introduced, the second inlet path being formed by a part of the second groove portion where the first hole portion is not formed, a first junction portion formed by a part where the first hole portion causes the first groove portion and the second groove portion to communicate with each other, the first junction portion for joining the first fluid flowing through the first inlet path and the second fluid flowing through the second inlet path in the thickness direction of the substrate, a first joined fluid flow passage through which a fluid made by joining both the fluids in the first junction portion flows, the first joined fluid flow passage being formed by a part of the first groove portion placed between the first hole portion and the second hole portion, a branch portion formed by a part where the second hole portion causes the first groove portion and the third groove portion to communicate with each other, the branch portion for dividing the fluid flowing through the first joined fluid flow passage into two fluids in the thickness direction of the substrate, a first branch path through which one of the two fluids divided by the branch portion flows, the first branch path being formed by a part of the first groove portion placed on the opposite side of the first hole portion with respect to the second hole portion, and a second branch path through which the other of the two fluids divided by the branch portion flows, the second branch path being formed by a part of the third groove portion where the second hole portion is not formed, and a corresponding diameter of the first branch path and a corresponding diameter of the second branch path in each of the passageways are smaller than a corresponding diameter of the first joined fluid flow passage in the passageway.

BRIEF DESCRIPTION OF DRAWINGS

FIG. 8 A sectional view along the longitudinal direction of a passageway of a flow passage structure according to a second embodiment of the present invention, the view corresponding to FIG. 3.

DESCRIPTION OF EMBODIMENTS

Figure 1:
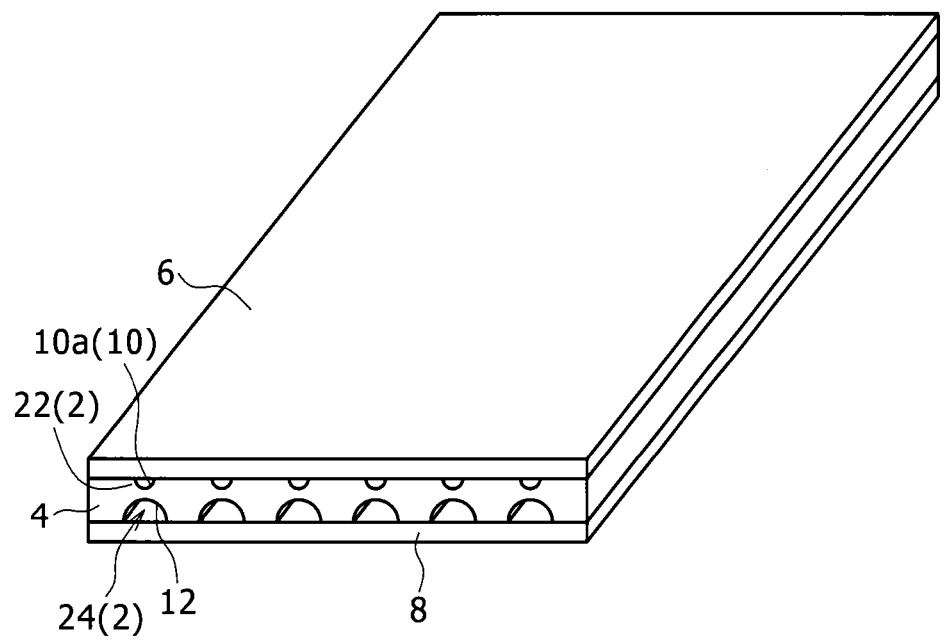
FIG. 1 A perspective view of a flow passage structure according to a first embodiment.

Hereinafter, embodiments of the present invention will be described with reference to the drawings.

First Embodiment

Firstly, with reference to FIGS. 1 to 7, a configuration of a flow passage structure according to a first embodiment of the present invention will be described.

The flow passage structure according to the first embodiment is used for producing an interaction between a plurality of fluids by mixing the fluids. The flow passage structure has a plurality of flow passageways 2 therein for circulating a first fluid and a second fluid in such a manner that the fluids are mixed with each other.

The flow passage structure is used, for example, in a microreactor, a heat exchanger, a reactor for an extraction reaction, a mixer for emulsionization, or the like. In a case where the flow passage structure is used in the microreactor, two fluids of mutually reactive reacting agents are circulated through the flow passageways 2 and mixed with each other within the flow passage structure, so that a chemical reaction is generated as an interaction between the fluids, and a desired reaction product is obtained. In this case, both the first fluid and the second fluid may be a liquid or a gas, or one of the fluids is a liquid and the other is a gas. In a case where the flow passage structure is used in the heat exchanger, a fluid circulated through the flow passageways 2 within the flow passage structure is a two-phase flow of a liquid and a gas, a single-phase flow of a liquid, or a single-phase flow of a gas. In a case where the fluid circulated through the flow passageways 2 is the two-phase flow of the liquid and the gas, that is, in a case where one of the first fluid and the second fluid is a gas and the other is a liquid, uniform vaporization or uniform condensation is desired to be performed. In this case, the two fluids are circulated through the flow passageways 2 and mixed with each other within the flow passage structure, so that uniform heat transfer with less drift is performed. In a case where the fluid circulated through the flow passageways 2 is the single-phase flow, that is, in a case where both the first fluid and the second fluid are a liquid or a gas, heat transfer between both the fluids is expected to be facilitated by active update of a contact interface between the first fluid and the second fluid. In a case where the flow passage structure is used in the reactor for the extraction reaction, one fluid containing an object to be extracted and the other fluid serving as an extraction medium are circulated through the flow passageways 2 and mixed with each other within the flow passage structure, so that the object to be extracted is extracted from the one fluid to the other fluid. In this case, both the first fluid and the second fluid are a liquid. In a case where the flow passage structure is used in the mixer for the emulsionization, the two fluids are circulated through the flow passageways 2 and mixed with each other within the flow passage structure, so that one of the two fluids is emulsionized. In this case, both the first fluid and the second fluid are a liquid.

As shown in FIG. 1, the flow passage structure includes a substrate 4, a first sealing plate 6, and a second sealing plate 8. The substrate 4, the first sealing plate 6, and the second sealing plate 8 are respectively formed by rectangular flat plates.

Figure 2:
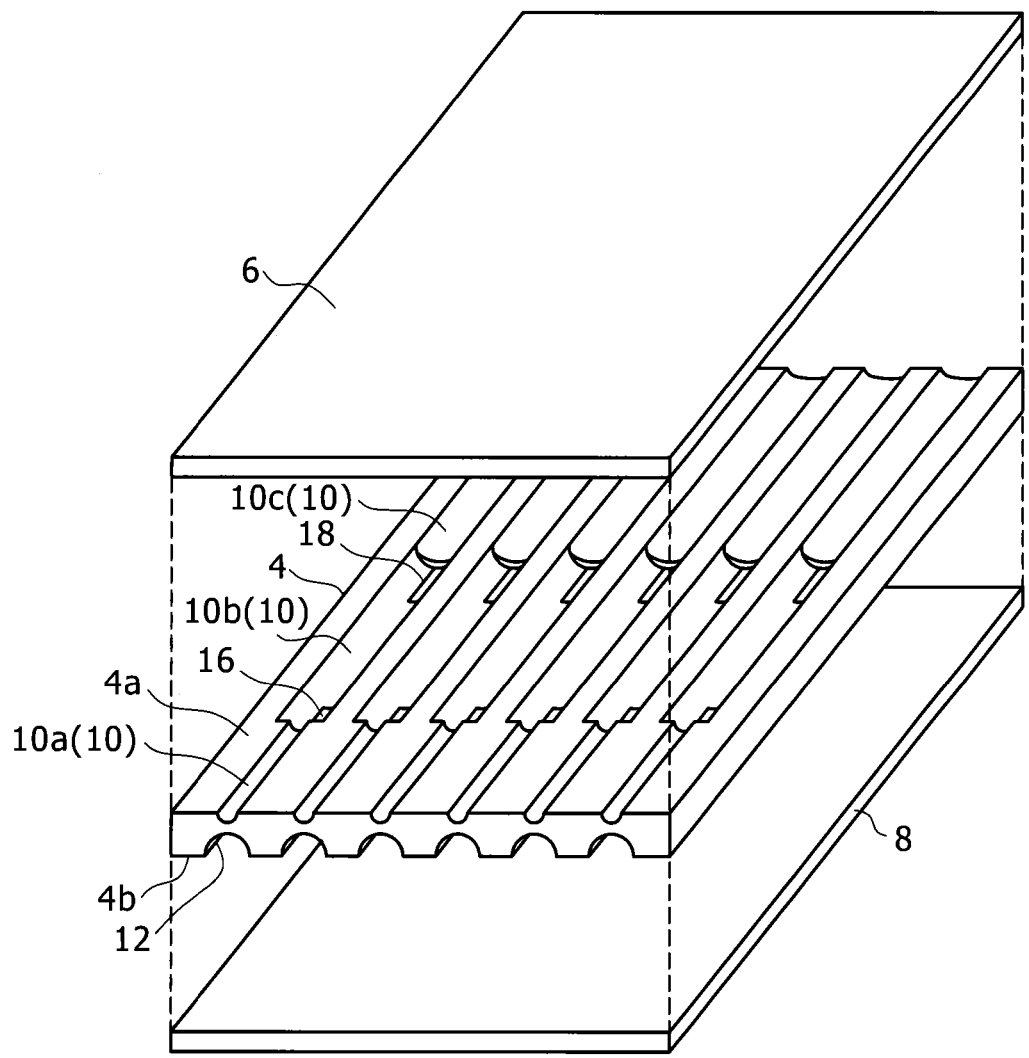
FIG. 2 An exploded perspective view of the flow passage structure shown in FIG. 1.

As shown in FIG. 2, the substrate 4 has a front surface 4a facing one side in the thickness direction thereof, and a back surface 4b facing in the opposite direction to the front surface 4a. The first sealing plate 6 is bonded to the front surface 4a so as to cover the front surface 4a of the substrate 4. The second sealing plate 8 is bonded to the back surface 4b so as to cover the back surface 4b of the substrate 4. That is, the substrate 4 and both the sealing plates 6, 8 are integrated with each other in a state that the substrate 4 is sandwiched between the first sealing plate 6 and the second sealing plate 8. The substrate 4 and both the sealing plates 6, 8 which are integrated with each other form the flow passage structure.

A plurality of first groove portions 10 is formed on the front surface 4a of the substrate 4 by etching. The plurality of first groove portions 10 is arranged so as to linearly extend in a particular direction side by side in parallel to each other at equal intervals. The first groove portions 10 are respectively opened on the front surface 4a of the substrate 4. The first sealing plate 6 is bonded to the front surface 4a of the substrate 4 so as to seal openings of the first groove portions 10 on the side of the front surface 4a of the substrate 4. Each of the groove portions 10 includes a first part 10a, a second part 10b, and a third part 10c. The first part 10a, the second part 10b, and the third part 10c respectively have different cross-sectional shapes in the direction perpendicular to the longitudinal direction of the first groove portion 10. The first part 10a, the second part 10b, and the third part 10c respectively have predetermined lengths and particular depths. The first part 10a, the second part 10b, and the third part 10c are arranged in this order from the one end side of the first groove portion 10 toward the other end side.

Figure 4:
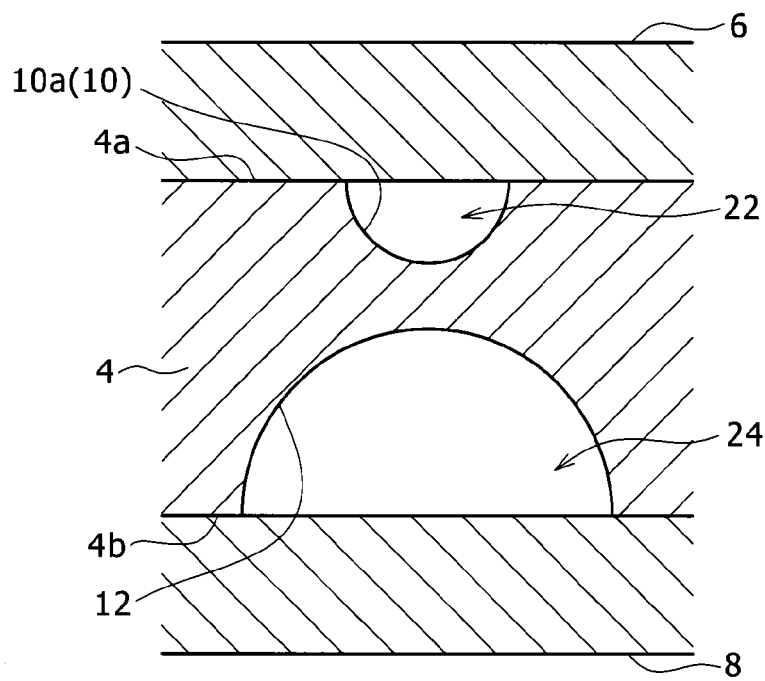
FIG. 4 A sectional view along the line IV-IV in FIG. 3 of the flow passage structure according to the first embodiment of the present invention.

As shown in FIG. 4, the first part 10a has an inner surface formed so as to have an arc shape cross section in the direction perpendicular to the longitudinal direction of the first part 10a.

Figure 6:
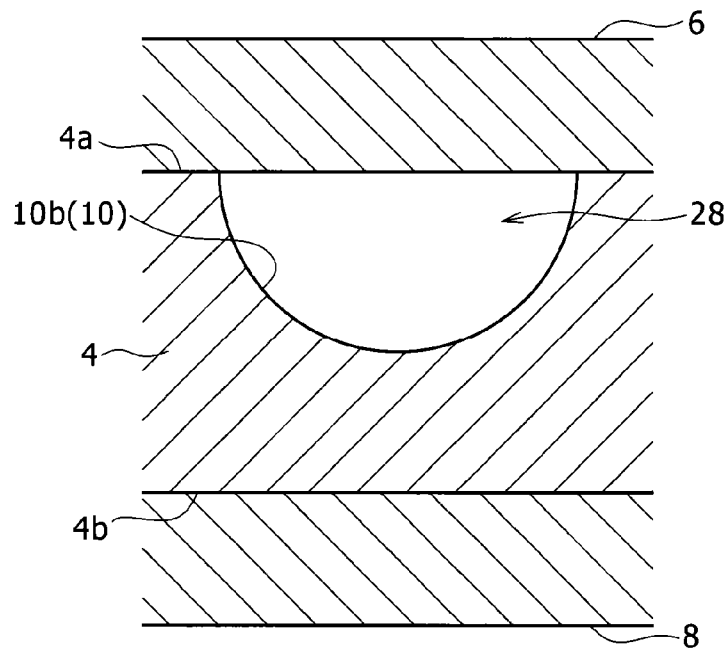
FIG. 6 A sectional view along the line VI-VI in FIG. 3 of the flow passage structure according to the first embodiment of the present invention.

As shown in FIG. 6, the second part 10b has an inner surface formed so as to have an arc shape cross section in the direction perpendicular to the longitudinal direction of the second part 10b. The second part 10b has a larger depth and a larger width than the first part 10a. That is, the arc shape cross section of the inner surface of the second part 10b has a larger radius than a radius of the arc shape cross section of the inner surface of the first part 10a.

The third part 10c has a width equal to the width of the second part 10b and has a smaller depth than the depth of the second part 10b. The third part 10c has an inner surface including a planar bottom surface part arranged in parallel to the front surface 4a of the substrate 4, and curved surface parts respectively connected to the front surface 4a of the substrate 4 from both ends in the width direction of the bottom surface part.

On the back surface 4b of the substrate 4, a plurality of second groove portions 12 extending in a particular direction (refer to FIG. 2), and a plurality of third groove portions 14 spaced from the second groove portions 12 in the longitudinal direction of the second groove portions 12 (refer to FIG. 7) are formed by etching.

The second groove portions 12 are arranged on the back side of the first parts 10a of the first groove portions 10 so as to extend in parallel to the first parts 10a. That is, the first parts 10a of the first groove portions 10 and the second groove portions 12 are arranged side by side in parallel to each other in the thickness direction of the substrate 4. The second groove portions 12 are arranged side by side in parallel to each other at equal intervals. The second groove portions 12 are respectively opened on the back surface 4b of the substrate 4. Ends of the second groove portions 12 on the side of the third groove portions 14 are arranged so as to be overlapped with ends of the second parts 10b of the first groove portions 10 placed on the front side of the second groove portions 12, the ends being on the side of the first parts 10a in the planar direction of the substrate 4 (in the direction parallel to the front surface 4a and the back surface 4b). As shown in FIG. 4, each of the second groove portions 12 has an inner surface formed so as to have an arc shape cross section in the direction perpendicular to the longitudinal direction of the second groove portion 12. The second groove portion 12 has a larger width and a larger depth than the first part 10a of the first groove portion 10. That is, the arc shape cross section of the inner surface of the second groove portion 12 has a larger radius than the radius of the arc shape cross section of the inner surface of the first part 10a.

The third groove portions 14 are arranged on the back side of the third parts 10c of the first groove portions 10 so as to extend in parallel to the third parts 10c. That is, the third parts 10c of the first groove portions 10 and the third groove portions 14 are arranged side by side in parallel to each other in the thickness direction of the substrate 4. The third groove portions 14 are arranged side by side in parallel to each other at equal intervals. The third groove portions 14 are respectively opened on the back surface 4b of the substrate 4. Ends of the third groove portions 14 on the side of the second groove portions 12 are arranged so as to be overlapped with ends of the second parts 10b of the first groove portions 10 placed on the front side of the third groove portions 14, the ends being on the side of the third parts 10c in the planar direction of the substrate 4. Each of the third groove portions 14 has a shape in which the shape of the third part 10c of the first groove portion 10 is reversed in the thickness direction of the substrate 4.

The second sealing plate 8 is bonded to the back surface 4b of the substrate 4 so as to seal openings of the second groove portions 12 and the third groove portions 14 on the side of the back surface 4b of the substrate 4.

As shown in FIG. 2, a plurality of first hole portions 16 and a plurality of second hole portions 18 are formed in the substrate 4.

Each of the first hole portions 16 is formed in a part of the substrate 4 where the end of the second groove portion 12 on the side of the third groove portion 14 is placed. The first hole portion 16 penetrates the substrate 4 from the front surface 4a to the back surface 4b in the thickness direction of the substrate 4 so as to cause the second groove portion 12 to communicate with the end of the second part 10b of the first groove portion 10 placed on the front side of the second groove portion, the end being on the side of the first part 10a.

Each of the second hole portions 18 is formed in a part of the substrate 4 where the end of the third groove portion 14 on the side of the second groove portion 12 is placed. The second hole portion 18 penetrates the substrate 4 from the front surface 4a to the back surface 4b in the thickness direction of the substrate 4 so as to cause the third groove portion 14 to communicate with the end of the second part 10b of the first groove portion 10 placed on the front side of the third groove portion, the end being on the side of the third part 10c.

Figure 3:
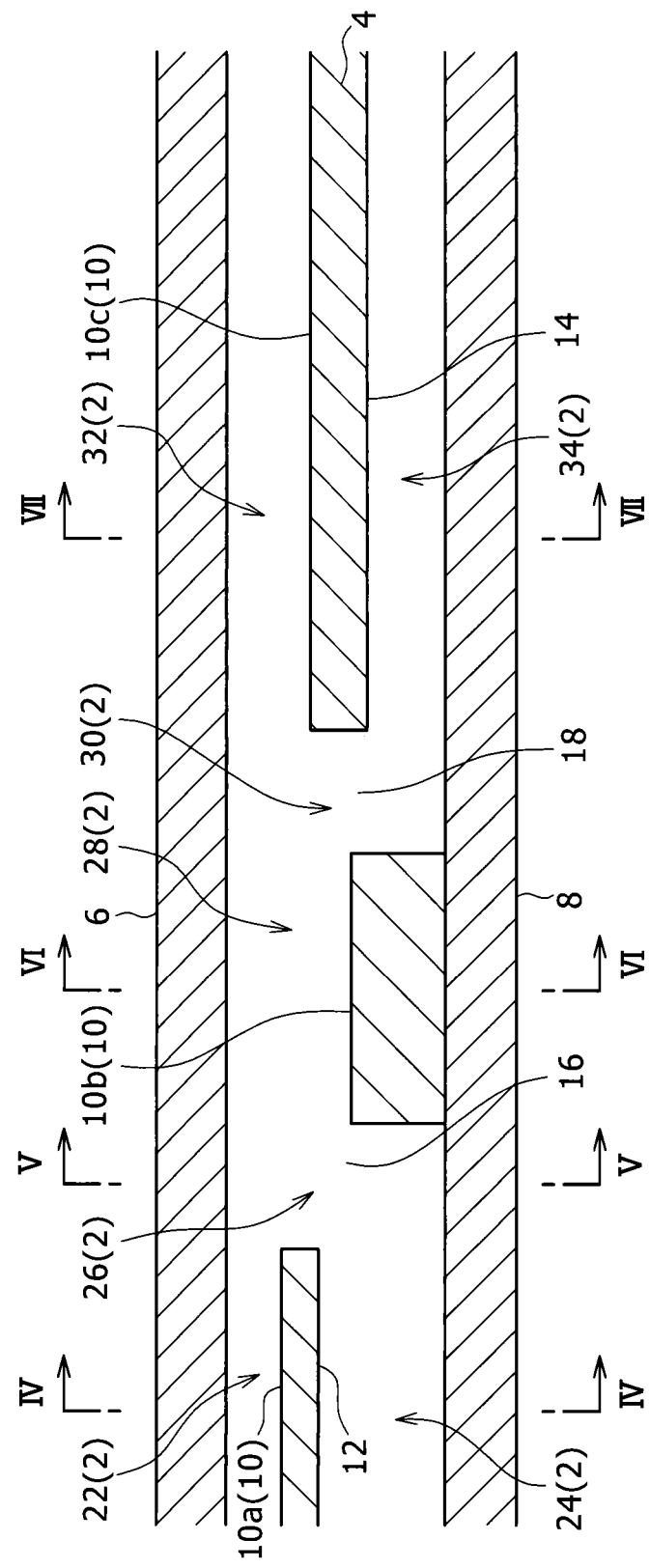
FIG. 3 A vertically sectional view along the longitudinal direction of a passageway of the flow passage structure shown in FIG. 1.

The plurality of flow passageways 2 provided in the flow passage structure is arranged side by side in parallel to each other at equal intervals in the planar direction of the substrate 4. As shown in FIG. 3, each of the flow passageways 2 has a first inlet path 22, a second inlet path 24, a junction portion 26, a joined fluid flow passage 28, a branch portion 30, a first branch path 32, and a second branch path 34.

The first inlet path 22 is a part into which the first fluid is introduced to flow. The first inlet path 22 linearly extends in a particular direction. The first inlet path 22 is formed by a part of the first groove portion 10 whose opening on the side of the front surface 4a of the substrate 4 is sealed by the first sealing plate 6, the part being placed on the opposite side of the second hole portion 18 with respect to the first hole portion 16. That is, the first inlet path 22 is formed by the first part 10a of the first groove portion 10 whose opening on the side of the front surface 4a is sealed by the first sealing plate 6. A cross-sectional shape of the first inlet path 22 in the direction perpendicular to the longitudinal direction has a semi-circular shape whose arc shape part faces the side of the back surface 4b of the substrate 4 as shown in FIG. 4.

The second inlet path 24 (refer to FIG. 3) is a part into which the second fluid is introduced to flow. The second inlet path 24 is arranged on the back side of the first inlet path 22 of the flow passageway 2 having the second inlet path 24 and extends in parallel to the first inlet path 22. That is, in the flow passageway 2, the first inlet path 22 and the second inlet path 24 are arranged side by side in parallel to each other in the thickness direction of the substrate 4. The second inlet path 24 is formed by a part of the second groove portion 12 whose opening on the side of the back surface 4b of the substrate 4 is sealed by the second sealing plate 8, the part where the first hole portion 16 is not formed. That is, the second inlet path is formed by a part of the second groove portion 12 placed on the opposite side of the third groove portion 14 with respect to the first hole portion 16. A cross-sectional shape of the second inlet path 24 in the direction perpendicular to the longitudinal direction has a semi-circular shape whose arc shape part faces the side of the front surface 4a of the substrate 4 as shown in FIG. 4. A depth of the second inlet path 24 in the thickness direction of the substrate 4 is larger than a depth of the first inlet path 22 in the same direction. A width of the second inlet path 24 in the planar direction of the substrate 4 (in the direction parallel to the back surface 4b) and in the direction perpendicular to the longitudinal direction of the second inlet path 24 is larger than a width of the first inlet path 22 in the planar direction of the substrate 4 (in the direction parallel to the front surface 4a) and in the direction perpendicular to the longitudinal direction of the first inlet path 22. The second inlet path 24 has a larger corresponding diameter than a corresponding diameter of the first inlet path 22.

Figure 5:
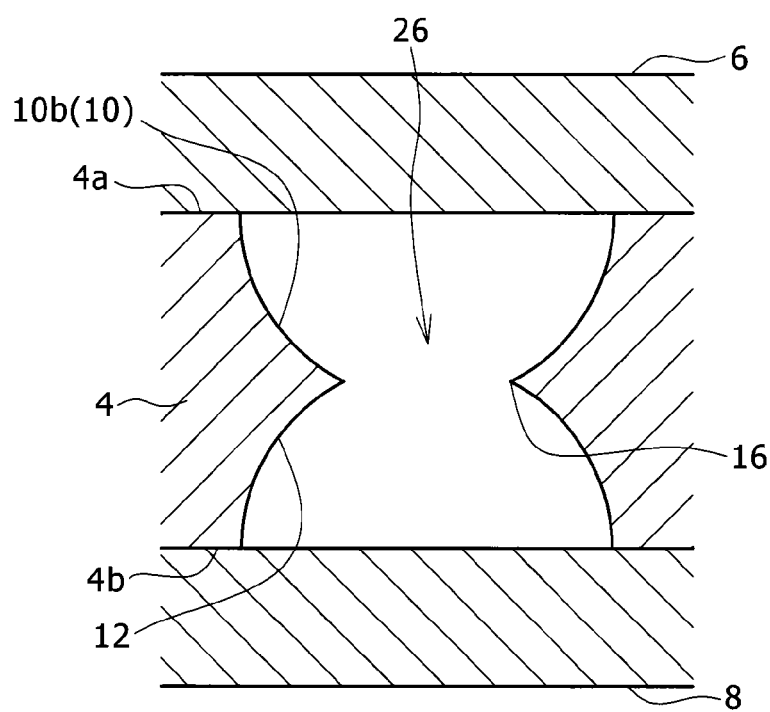
FIG. 5 A sectional view along the line V-V in FIG. 3 of the flow passage structure according to the first embodiment of the present invention.

The junction portion 26 (refer to FIG. 3) is a part for joining the first fluid flowing through the first inlet path 22 and the second fluid flowing through the second inlet path 24 in the thickness direction of the substrate 4. The junction portion 26 falls in the scope of the first junction portion of the present invention. The junction portion 26 is connected to downstream parts of the first inlet path 22 and the second inlet path 24. The junction portion 26 extends in the same direction as both the inlet paths 22, 24. A cross-sectional shape of the junction portion 26 in the direction perpendicular to the longitudinal direction of both the inlet paths 22, 24 has such a shape that two semicircles disposed symmetrically to each other in the thickness direction of the substrate 4 are overlapped with each other in the vicinity of apexes thereof as shown in FIG. 5. The junction portion 26 is formed by a part where the first hole portion 16 causes the second part 10b of the first groove portion 10 whose opening on the side of the front surface 4a of the substrate 4 is sealed by the first sealing plate 6 and the second groove portion 12 whose opening on the side of the back surface 4b of the substrate 4 is sealed by the second sealing plate 8 to communicate with each other.

The joined fluid flow passage 28 (refer to FIG. 3) is a part through which a fluid made by joining the first fluid and the second fluid in the junction portion 26 flows. The joined fluid flow passage 28 falls in the scope of the first joined fluid flow passage of the present invention. The joined fluid flow passage 28 is connected to a downstream part of the junction portion 26. The joined fluid flow passage 28 extends in the same direction as the junction portion 26. The joined fluid flow passage 28 is formed by a part of the second part 10b of the first groove portion 10 whose opening on the side of the front surface 4a of the substrate 4 is sealed by the first sealing plate 6, the part being placed between the first hole portion 16 and the second hole portion 18. A cross-sectional shape of the joined fluid flow passage 28 in the direction perpendicular to the longitudinal direction has a semi-circular shape whose arc shape part faces the side of the back surface 4b of the substrate 4 as shown in FIG. 6. A depth of the joined fluid flow passage 28 in the thickness direction of the substrate 4 is larger than the depth of the first inlet path 22 in the same direction. A width of the joined fluid flow passage 28 in the planar direction of the substrate 4 (in the direction parallel to the front surface 4a) and in the direction perpendicular to the longitudinal direction of the joined fluid flow passage 28 is larger than the width of the first inlet path 22 in the planar direction of the substrate 4 and in the direction perpendicular to the longitudinal direction of the first inlet path 22. The joined fluid flow passage 28 has a larger corresponding diameter than the corresponding diameter of the first inlet path 22.

The branch portion 30 (refer to FIG. 3) is a part for dividing the fluid flowing through the joined fluid flow passage 28 into two fluids in the thickness direction of the substrate 4. The branch portion 30 is connected to a downstream part of the joined fluid flow passage 28. The branch portion 30 extends in the same direction as the joined fluid flow passage 28. The branch portion 30 is formed by a part where the second hole portion 18 causes the second part 10b of the first groove portion 10 whose opening on the side of the front surface 4a of the substrate 4 is sealed by the first sealing plate 6 and the third groove portion 14 whose opening on the side of the back surface 4b of the substrate 4 is sealed by the second sealing plate 8 to communicate with each other.

The first branch path 32 is a part through which one of the two fluids divided by the branch portion 30 flows. The first branch path 32 is connected to a downstream part of the branch portion 30. The first branch path 32 extends in the same direction as the branch portion 30. The first branch path 32 is arranged on the side of the front surface 4a of the substrate 4. The first branch path 32 is formed by a part of the first groove portion 10 whose opening on the side of the front surface 4a of the substrate 4 is sealed by the first sealing plate 6, the part being placed on the opposite side of the first hole portion 16 with respect to the second hole portion 18. That is, the first branch path 32 is formed by the third part 10c of the first groove portion 10 whose opening on the side of the front surface 4a is sealed by the first sealing plate 6.

Figure 7:
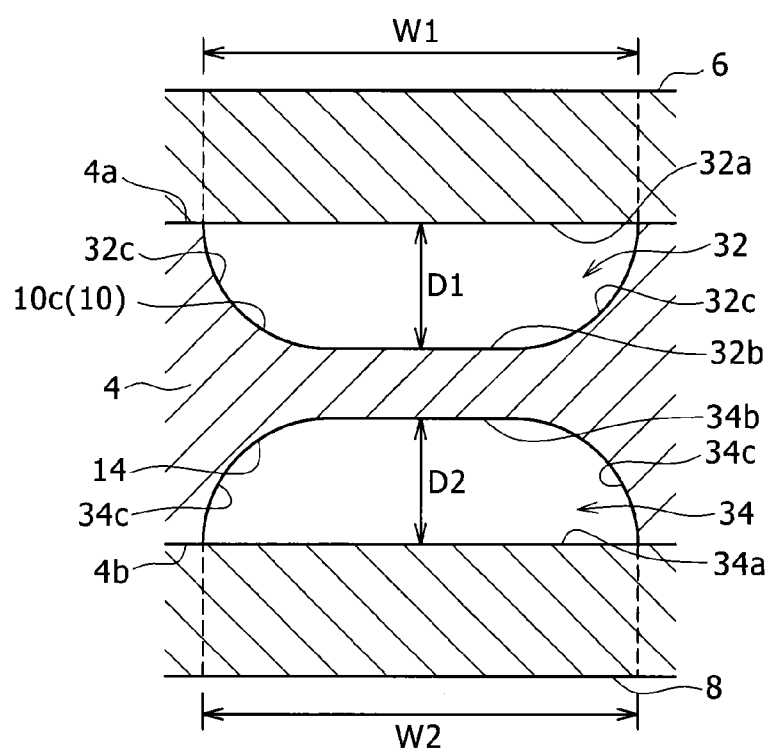
FIG. 7 A sectional view along the line VII-VII in FIG. 3 of the flow passage structure according to the first embodiment of the present invention.

A cross-sectional shape of the first branch path 32 in the direction perpendicular to the longitudinal direction has a shape as shown in FIG. 7. Specifically, the cross-sectional shape of the first branch path 32 includes a linear first sealing part 32a formed by a surface of the first sealing plate 6 on the side of the substrate 4, a linear first straight part 32b arranged in parallel to the first sealing part 32a and formed by a bottom surface part of the third part 10c of the first groove portion 10, and two arc shape first arc parts 32c for connecting ends of the first sealing part 32a in the width direction of the first branch path 32 and corresponding ends of the first straight part 32b, the first arc parts being convexed on the outer side of the first branch path 32. A depth D1 of the first branch path 32 in the thickness direction of the substrate 4 is smaller than the depth of the joined fluid flow passage 28 in the same direction. A width W1 of the first branch path 32 in the planar direction of the substrate 4 (in the direction parallel to the front surface 4a) and in the direction perpendicular to the longitudinal direction of the first branch path 32 is equal to the width of the joined fluid flow passage 28 in the planar direction of the substrate 4 and in the direction perpendicular to the longitudinal direction of the joined fluid flow passage 28. A ratio D1/W1 between the depth D1 and the width W1 of the first branch path 32 is less than 0.5. The first branch path 32 has a smaller corresponding diameter than the corresponding diameter of the joined fluid flow passage 28.

The second branch path 34 (refer to FIG. 3) is a part through which the other of the two fluids divided by the branch portion 30, that is, the fluid other than the fluid flowing through the first branch path 32 flows. The second branch path 34 is connected to the downstream part of the branch portion 30. The second branch path 34 extends in the same direction as the branch portion 30. The second branch path 34 is arranged on the side of the back surface 4b of the substrate 4. The second branch path 34 and the first branch path 32 of the flow passageway 2 are arranged side by side in parallel to each other in the thickness direction of the substrate 4. The second branch path 34 is formed by a part of the third groove portion 14 whose opening on the side of the back surface 4b of the substrate 4 is sealed by the second sealing plate 8, the part where the second hole portion 18 is not formed.

A cross-sectional shape of the second branch path 34 in the direction perpendicular to the longitudinal direction has a shape in which the cross-sectional shape of the first branch path 32 in the direction perpendicular to the longitudinal direction is reversed in the thickness direction of the substrate 4 as shown in FIG. 7. Therefore, the cross-sectional shape of the second branch path 34 includes a second sealing part 34a, a second straight part 34b, and two second arc parts 34c corresponding to the first sealing part 32a, the first straight part 32b, and the two first arc parts 32c of the cross-sectional shape of the first branch path 32. A ratio D2/W2 between a depth D2 and a width W2 of the second branch path 34 is less than 0.5. The second branch path 34 has a smaller corresponding diameter than the corresponding diameter of the joined fluid flow passage 28.

Next, a process when the first fluid and the second fluid are circulated through the flow passageway 2 of the flow passage structure according to the first embodiment so as to produce an interaction will be described.

Firstly, the first fluid is introduced into the first inlet path 22, and the second fluid is introduced into the second inlet path 24. Both the first fluid introduced into the first inlet path 22 and the second fluid introduced into the second inlet path 24 flow toward the downstream side into the junction portion 26. The first fluid flowing into the junction portion 26 from the first inlet path 22 flows toward the downstream side while slightly moving to the side of the back surface 4b of the substrate 4. The second fluid flowing into the junction portion 26 from the second inlet path 24 flows toward the downstream side while slightly moving to the side of the front surface 4a of the substrate 4. Therefore, in the junction portion 26, the first fluid and the second fluid are joined while colliding with each other in the thickness direction of the substrate 4. As a result, the first fluid and the second fluid are mixed with each other.

The first fluid and the second fluid brought into a mixed state in the junction portion 26 produce the interaction on a contact interface between the fluids while flowing toward the downstream side in the joined fluid flow passage 28. A mixed fluid of the first fluid and the second fluid is divided into two fluids in the branch portion 30. One of the divided mixed fluids flows through the first branch path 32, and the other mixed fluid flows through the second branch path 34. In the branch paths 32, 34, while the flowing mixed fluids flow toward the downstream side, the first fluid and the second fluid contained in the fluids produce the interaction on the contact interface between the fluids.

As in the above description, the interaction between the first fluid and the second fluid circulated through the flow passageway 2 is performed.

As described above, in the flow passage structure according to the first embodiment, after the mixed fluid made by joining and mixing the first fluid and the second fluid in the junction portion 26 flows through the joined fluid flow passage 26, a flow of the mixed fluid is divided into the first branch path 32 and the second branch path 34 having a smaller corresponding diameter than the joined fluid flow passage 28 in the branch portion 30. Thus, an area of the contact interface between the first fluid and the second fluid per unit volume in the mixed fluid flowing through both the branch paths 32, 34 is larger than an area of the contact interface between the first fluid and the second fluid per unit volume in the mixed fluid flowing through the joined fluid flow passage 28. As a result, the interaction between the first fluid and the second fluid can be facilitated in both the branch paths 32, 34 on the downstream side of the joined fluid flow passage 28. In the flow passage structure according to the first embodiment, when the mixed fluid is divided in the branch portion 30, turbulence is generated in the flow of the fluid, so that the contact interface between the first fluid and the second fluid contained in the fluid can be updated. Due to this, the interaction between the first fluid and the second fluid can be facilitated. Further, in the flow passage structure according to the first embodiment, the first inlet path 22 and the second inlet path 24 are arranged side by side in the thickness direction of the substrate 4, both the inlet paths 22, 24 are joined together in the thickness direction of the substrate 4 by the junction portion 26, and the first branch path 32 and the second branch path 34 branched from the branch portion 30 are arranged side by side in the thickness direction of the substrate 4. Thus, in comparison to a flow passage structure in which a first inlet path and a second inlet path are arranged side by side on the same surface of a substrate and a first branch path and a second branch path are arranged side by side on the same surface of the substrate, the plurality of flow passageways 2 can be more closely arranged in the planar direction of the substrate 4. As a result, even with the flow passage structure of the same size, more flow passageways 2 can be provided. Therefore, in the first embodiment, without increasing size of the flow passage structure, a treatment amount by the interaction between the two fluids in the entire flow passage structure can be increased, and the interaction between the fluids after joining the two fluids can be facilitated.

In the first embodiment, the sum of a cross-sectional area of the first branch path 32 perpendicular to the longitudinal direction and a cross-sectional area of the second branch path 34 perpendicular to the longitudinal direction in the passageway 2 is larger than a cross-sectional area of the first joined fluid flow passage 28 perpendicular to the longitudinal direction in the passageway 2. Thus, a total circulation amount of the fluids flowing through both the branch paths 32, 34 can be ensured to be not less than a circulation amount of the fluid flowing through the joined fluid flow passage 28. Therefore, in the first embodiment, while facilitating the interaction between the first fluid and the second fluid, a decrease in the treatment amount by the interaction between both the fluids can be prevented.

In the first embodiment, the ratio D1/W1 between the depth D1 and the width W1 of the first branch path 32 is less than 0.5, and the ratio D2/W2 between the depth D2 and the width W2 of the second branch path 34 is less than 0.5. Thus, both the branch paths 32, 34 are wide flow passages. Therefore, in both the branch paths 32, 34, the area of the contact interface between the first fluid and the second fluid can be increased. Consequently, the interaction between the first fluid and the second fluid in both the branch paths 32, 34 can be more facilitated.

For example in a case where a radius of the arc parts 32c, 34c in the cross sections of the branch paths 32, 34 perpendicular to the longitudinal direction is 0.3 mm and a length of the straight parts 32b, 34b is 0.3 mm in the configuration of the first embodiment, the sum of cross-sectional areas of both the branch paths 32, 34 is about 1.46 times more than a cross-sectional area of a flow passage having a semi-circular cross-sectional shape with a radius of 0.45 mm, and the corresponding diameter of each of the branch paths 32, 34 is decreased by about 21% relative to a corresponding diameter of a flow passage having a semi-circular cross-sectional shape with a radius of 0.45 mm.

In the flow passage structure, a circulation amount of fluids flowing through a flow passage (treatment amount of the fluids) is generally proportional to a cross-sectional area of the flow passage. In a case where heat transfer is generated between the fluids as an interaction between the fluids in the flow passage, a heat transfer coefficient thereof is generally increased in inverse proportion to a corresponding diameter of the flow passage. In a case where diffusion of substances is generated between the fluids as the interaction between the fluids in the flow passage, a diffusion time of the substances is generally proportional to the square of the corresponding diameter of the flow passage. Therefore, as in the first embodiment, by providing the branch paths 32, 34 of the above configuration in each of the passageways 2, treatment of high-capacity fluids can be performed, and efficiency of an interaction between two fluids such as heat transfer efficiency and/or diffusion efficiency of substances can be improved.

Second Embodiment

Next, with reference to FIG. 8, a configuration of a flow passage structure according to a second embodiment of the present invention will be described.

In the flow passage structure according to the second embodiment, each of the flow passageways 2 in the flow passage structure is formed in such a manner that the fluids divided into the first branch path 32 and the second branch path 34 in the branch portion 30 can be joined again.

Each of the first groove portions 10 formed on the front surface 4a of the substrate 4 forming the flow passage structure includes the first part 10a, the second part 10b, the third part 10c, and a fourth part 10d. The fourth part 10d is connected to an end of the third part 10c on the opposite side of the second part 10b, and extends in the same direction as the third part 10c. A cross-sectional shape of the fourth part 10d in the direction perpendicular to the longitudinal direction is the same as the cross-sectional shape of the second part 10b in the direction perpendicular to the longitudinal direction. An end of the third groove portion 14 formed on the back surface 4b of the substrate 4, the end being on the opposite side of the second groove portion 12 is arranged so as to be overlapped with an end of the fourth part 10d of the first groove portion 10 placed on the front side of the third groove portion 14, the end being on the side of the third part 10c in the planar direction of the substrate 4.

A plurality of third hole portions 46 is formed in the substrate 4. Each of the third hole portions 46 is formed in a part of the substrate 4 where the end of the third groove portion 14 on the opposite side of the second groove portion 12 is placed. The third hole portion 46 penetrates the substrate 4 from the front surface 4a to the back surface 4b in the thickness direction of the substrate 4 so as to cause the third groove portion 14 to communicate with the end of the fourth part 10d of the first groove portion 10 placed on the front side of the third groove portion, the end being on the side of the third part 10c.

Each of the flow passageways 2 of the flow passage structure according to the second embodiment has the first inlet path 22, the second inlet path 24, a first junction portion 36, a first joined fluid flow passage 38, the branch portion 30, the first branch path 32, the second branch path 34, a second junction portion 42, and a second joined fluid flow passage 44.

A configuration of the first junction portion 36 is the same as the configuration of the junction portion 26 in the first embodiment. A configuration of the first joined fluid flow passage 38 is the same as the configuration of the joined fluid flow passage 28 in the first embodiment.

The second junction portion 42 is a part for joining the fluid flowing through the first branch path 32 and the fluid flowing through the second branch path 34 in the thickness direction of the substrate 4. The second junction portion 42 is connected to downstream parts of the first branch path 32 and the second branch path 34, and extends in the same direction as both the branch paths 32, 34. The second junction portion 42 is formed by a part where the third hole portion 46 causes the fourth part 10d of the first groove portion 10 whose opening on the side of the front surface 4a of the substrate 4 is sealed by the first sealing plate 6 and the third groove portion 14 whose opening on the side of the back surface 4b of the substrate 4 is sealed by the second sealing plate 8 to communicate with each other.

The second joined fluid flow passage 44 is a part through which a fluid made by joining the fluids in the second junction portion 42 flows. The second joined fluid flow passage 44 is connected to a downstream part of the second junction portion 42, and extends in the same direction as the second junction portion 42. The second joined fluid flow passage 44 is formed by a part of the fourth part 10d of the first groove portion 10 whose opening on the side of the front surface 4a of the substrate 4 is sealed by the first sealing plate 6, the part being placed on the opposite side of the second hole portion 18 with respect to the third hole portion 46. A cross-sectional shape of the second joined fluid flow passage 44 in the direction perpendicular to the longitudinal direction is the same as the cross-sectional shape of the first joined fluid flow passage 38 in the direction perpendicular to the longitudinal direction.

In the second embodiment, the fluid flowing into the second junction portion 42 from the first branch path 32 in the flow passageway 2 flows toward the downstream side while slightly moving to the side of the back surface 4b of the substrate 4. The fluid flowing into the second junction portion 42 from the second branch path 34 in the flow passageway 2 flows toward the downstream side while slightly moving to the side of the front surface 4a of the substrate 4. Therefore, in the second junction portion 42, the fluids flowing from both the branch paths 32, 34 are joined while colliding with each other in the thickness direction of the substrate 4. Thereby, the fluids are mixed with each other. As a result, the first fluid and the second fluid contained in the fluids are agitated. The fluid made by joining the fluids in the second junction portion 42 flows into the second joined fluid flow passage 44, and then, the first fluid and the second fluid contained in the fluid produce the interaction while flowing toward the downstream side in the flow passage 44.

A configuration of parts other than the above parts of the flow passage structure according to the second embodiment are the same as the configuration of the flow passage structure according to the first embodiment.

As described above, in the flow passage structure according to the second embodiment, when the fluids divided into the first branch path 32 and the second branch path 34 are joined in the second junction portion 42, and thereby the fluids are agitated. Thus, the contact interface between the first fluid and the second fluid contained in the fluid is updated and the area of the contact interface is increased. As a result, the interaction between the first fluid and the second fluid is facilitated in the second joined fluid flow passage 44. Therefore, the interaction between both the fluids can be more facilitated in the entire flow passage structure.

Effects of the second embodiment other than the above effect are the same as the effects of the first embodiment.

The embodiments disclosed herein are not a limitation but an example in all respects. The scope of the present invention is specified not by the above description of the embodiments but by the claims and further includes equal meanings to the claims and all the changes within the claims.

For example, in the second embodiment, a flow passage having the same structure as the branch portion 30, the first branch path 32, the second branch path 34, the second junction portion 42, and the second joined fluid flow passage 44 may be repeatedly and continuously formed on the downstream side of the second joined fluid flow passage 44. In this case, an effect of facilitating the interaction between the first fluid and the second fluid due to a decrease in the corresponding diameter in the branch paths and an effect of facilitating the interaction between both the fluids due to mixing of both the fluids in the junction portion can be further obtained. Thus, the interaction between both the fluids can be furthermore facilitated in the entire flow passage structure.

In the above embodiments, flow passages having various shapes such as a flow passage extending in the direction different from the first inlet path 22 and a flow passage having a bent or curved shape may be connected on the upstream side of the first inlet path 22 in the circulation direction of the fluids. The same flow passages may be connected on the upstream side of the second inlet path 24.

In the first embodiment, flow passages having various shapes such as a flow passage extending in the direction different from the first branch path 32 and a flow passage having a bent or curved shape may be connected on the downstream side of the first branch path 32 in the circulation direction of the fluids. The same flow passages may be connected on the downstream side of the second branch path 34.

In the second embodiment, flow passages having various shapes such as a flow passage extending in the direction different from the second joined fluid flow passage 44 and a flow passage having a bent or curved shape may be connected on the downstream side of the second joined fluid flow passage 44 in the circulation direction of the fluids.

The cross-sectional shape of each of the joined fluid flow passages 28, 38, 44 in the direction perpendicular to the longitudinal direction may have a shape with which a ratio between a depth and a width becomes less than 0.5 as well as the cross-sectional shape of the first branch path 32 in the direction perpendicular to the longitudinal direction.

For example, in a case where a radius of arc parts in cross sections of the joined fluid flow passages 28, 38, 44 perpendicular to the longitudinal direction is 0.3 mm and a length of second straight parts in the width direction of the joined fluid flow passages 28, 38, 44 is 0.6 mm, a cross-sectional area of each of the joined fluid flow passages 28, 38, 44 is substantially equal to a cross-sectional area of a flow passage having a semi-circular cross-sectional shape with a radius of 0.45 mm, and the corresponding diameter of each of the joined fluid flow passages 28, 38, 44 is decreased by about 15% relative to a corresponding diameter of a flow passage having a semi-circular cross-sectional shape with a radius of 0.45 mm. Therefore, according to the above configuration, in the joined fluid flow passages 28, 38, 44, while ensuring a circulation amount (treatment amount) of the first fluid and the second fluid, the area of the contact interface between the first fluid and the second fluid is increased, so that the interaction between the fluids can be facilitated.

Summary of Embodiments

The above embodiments are summarized as follows.

A flow passage structure according to the above embodiments has a plurality of flow passageways therein, the flow passageways for circulating a first fluid and a second fluid in such a manner that the fluids are mixed with each other, including a substrate having a front surface and a back surface facing in the opposite direction to the front surface, a first sealing plate bonded to the front surface of the substrate, and a second sealing plate bonded to the back surface of the substrate, wherein on the front surface of the substrate, a plurality of first groove portions arranged so as to extend in a particular direction side by side in parallel to each other is formed, on the back surface of the substrate, a plurality of second groove portions arranged on the back side of the first groove portions so as to extend in parallel to the first groove portions, and a plurality of third groove portions arranged on the back side of the first groove portions so as to extend in parallel to the first groove portions, the third groove portions being spaced from the second groove portions in the longitudinal direction of the second groove portions are formed, in a part of the substrate where ends of the second groove portions on the side of the third groove portions are placed, a plurality of first hole portions penetrating the substrate from the front surface to the back surface, the first hole portions for causing the second groove portions to communicate with the first groove portions placed on the front side of the second groove portions is formed, in a part of the substrate where ends of the third groove portions on the side of the second groove portions are placed, a plurality of second hole portions penetrating the substrate from the front surface to the back surface, the second hole portions for causing the third groove portions to communicate with the first groove portions placed on the front side of the third groove portions is formed, the first sealing plate is bonded to the front surface of the substrate so as to seal openings of the first groove portions on the front surface side, the second sealing plate is bonded to the back surface of the substrate so as to seal openings of the second groove portions on the back surface side and openings of the third groove portions on the back surface side, each of the passageways includes a first inlet path into which the first fluid is introduced, the first inlet path being formed by a part of the first groove portion which is placed on the opposite side of the second hole portion with respect to the first hole portion, a second inlet path into which the second fluid is introduced, the second inlet path being formed by a part of the second groove portion where the first hole portion is not formed, a first junction portion formed by a part where the first hole portion causes the first groove portion and the second groove portion to communicate with each other, the first junction portion for joining the first fluid flowing through the first inlet path and the second fluid flowing through the second inlet path in the thickness direction of the substrate, a first joined fluid flow passage through which a fluid made by joining both the fluids in the first junction portion flows, the first joined fluid flow passage being formed by a part of the first groove portion placed between the first hole portion and the second hole portion, a branch portion formed by a part where the second hole portion causes the first groove portion and the third groove portion to communicate with each other, the branch portion for dividing the fluid flowing through the first joined fluid flow passage into two fluids in the thickness direction of the substrate, a first branch path through which one of the two fluids divided by the branch portion flows, the first branch path being formed by a part of the first groove portion placed on the opposite side of the first hole portion with respect to the second hole portion, and a second branch path through which the other of the two fluids divided by the branch portion flows, the second branch path being formed by a part of the third groove portion where the second hole portion is not formed, and a corresponding diameter of the first branch path and a corresponding diameter of the second branch path in each of the passageways are smaller than a corresponding diameter of the first joined fluid flow passage in the passageway. It should be noted that the corresponding diameter of the flow passage indicates, assuming a flow passage having a circular cross section equal to a flow passage having an arbitrary cross-sectional shape, a diameter of the flow passage having the circular cross section. When the corresponding diameter of the flow passage is D, the cross section of the flow passage is A, and a circumference in the flow passage (length of a circle in the cross section) is U, the corresponding diameter D of the flow passage can be determined by the expression of $D=4A/U$.

In the flow passage structure, after the mixed fluid made by joining and mixing the first fluid and the second fluid in the first junction portion flows through the first joined fluid flow passage, a flow of the mixed fluid is divided into the first branch path and the second branch path having a smaller corresponding diameter than the first joined fluid flow passage in the branch portion. Thus, an area of a contact interface between the first fluid and the second fluid per unit volume of the mixed fluid in the mixed fluid flowing through both the branch paths is larger than an area of the contact interface between the first fluid and the second fluid per unit volume of the mixed fluid in the mixed fluid flowing through the first joined fluid flow passage. Therefore, in the present configuration, the interaction between the first fluid and the second fluid can be facilitated in both the branch paths on the downstream side of the first joined fluid flow passage. In the flow passage structure, when the mixed fluid is divided in the branch portion, turbulence is generated in a flow of the fluid, so that the contact interface between the first fluid and the second fluid contained in the fluid can be updated. Due to this, the interaction between the first fluid and the second fluid can be facilitated. Further, in the flow passage structure, the first inlet path and the second inlet path are arranged side by side in the thickness direction of the substrate, both the inlet paths are joined together in the thickness direction of the substrate by the first junction portion, and the first branch path and the second branch path branched from the branch portion are arranged side by side in the thickness direction of the substrate. Thus, in comparison to a flow passage structure in which a first inlet path and a second inlet path are arranged side by side on the same surface of a substrate and a first branch path and a second branch path are arranged side by side on the same surface of the substrate, the plurality of flow passageways can be more closely arranged in the planar direction of the substrate. As a result, in the present configuration, even with the flow passage structure of the same size, more flow passageways can be provided in the flow passage structure. Therefore, in the above configuration, without increasing the size of the flow passage structure, a treatment amount by the interaction between the two fluids can be increased, and the interaction between the fluids after joining the two fluids can be facilitated.

In the above flow passage structure, preferably, the sum of a cross-sectional area of the first branch path perpendicular to the longitudinal direction of the first branch path and a cross-sectional area of the second branch path perpendicular to the longitudinal direction of the second branch path in each of the passageways is not less than a cross-sectional area of the first joined fluid flow passage perpendicular to the longitudinal direction of the first joined fluid flow passage in the passageway.

A circulation amount of fluids flowing through a flow passage is generally proportional to a cross-sectional area of the flow passage. Thus, in the present configuration, a total circulation amount of the fluids flowing through both the branch paths can be ensured to be not less than a circulation amount of the fluid flowing through the first joined fluid flow passage. Therefore, in the present configuration, while facilitating the interaction between the first fluid and the second fluid, a decrease in the treatment amount by the interaction between both the fluids can be prevented.

In the above flow passage structure, preferably, in a part of the substrate where ends of the third groove portions on the opposite side to the second groove portions are placed, a plurality of third hole portions penetrating the substrate from the front surface to the back surface, the third hole portions for causing the third groove portions to communicate with the first groove portions placed on the front side of the third groove portions is formed, and each of the passageways includes a second junction portion formed by a part where the third hole portion causes the first groove portion and the third groove portion to communicate with each other, the second junction portion for joining the fluid flowing through the first branch path of the passageway and the fluid flowing through the second branch path of the passageway in the thickness direction of the substrate, and a second joined fluid flow passage through which a fluid made by joining the fluids in the second junction portion flows, the second joined fluid flow passage being formed by a part of the first groove portion placed on the opposite side of the second hole portion with respect to the third hole portion.

In the above configuration, since the fluids divided into the first branch path and the second branch path are joined in the second junction portion, the fluids are agitated in accordance with the joining. By the agitation of the fluids, the contact interface between the first fluid and the second fluid in the fluids is updated and the area of the contact interface is increased. Therefore, the interaction between the first fluid and the second fluid in the second joined fluid flow passage is facilitated. As a result, the interaction between both the fluids can be more facilitated in the entire flow passage structure.

In the above flow passage structure, preferably, a ratio $D1/W1$ between a depth $D1$ of each of the first branch paths in the thickness direction of the substrate and a width $W1$ of the first branch path in the direction parallel to the front surface of the substrate and in the direction perpendicular to the longitudinal direction of the first branch path is less than 0.5.

According to the above configuration, since the first branch path becomes a wide flow passage, the area of the contact interface between the first fluid and the second fluid flowing in the first branch path can be increased. Therefore, the interaction between the first fluid and the second fluid in the first branch path can be more facilitated.

In the above flow passage structure, preferably, a ratio D2/W2 between a depth D2 of each of the second branch paths in the thickness direction of the substrate and a width W2 of the second branch path in the direction parallel to the back surface of the substrate and in the direction perpendicular to the longitudinal direction of the second branch path is less than 0.5.

According to the above configuration, since the second branch path becomes a wide flow passage, the area of the contact interface between the first fluid and the second fluid flowing in the second branch path can be increased. Therefore, the interaction between the first fluid and the second fluid in the second branch path can be more facilitated.

As described above, according to the above embodiments, without increasing the size of the flow passage structure, the treatment amount by the interaction between the two fluids can be increased, and the interaction between the fluids after joining the two fluids can be facilitated.

The invention claimed is:

1. A flow passage structure having a plurality of flow passageways therein, the flow passageways for circulating a first fluid and a second fluid in such a manner that the fluids are mixed with each other, comprising:
   a substrate having a front surface and a back surface facing in the opposite direction to the front surface;
   a first sealing plate bonded to the front surface of said substrate; and
   a second sealing plate bonded to the back surface of said substrate, wherein
   on the front surface of said substrate, a plurality of first groove portions arranged so as to extend in a particular direction side by side in parallel to each other is formed,
   on the back surface of said substrate, a plurality of second groove portions arranged on the back side of the first groove portions so as to extend in parallel to the first groove portions, and a plurality of third groove portions arranged on the back side of the first groove portions so as to extend in parallel to the first groove portions, the third groove portions being spaced from the second groove portions in the longitudinal direction of the second groove portions are formed,
   in a part of said substrate where ends of the second groove portions on the side of the third groove portions are placed, a plurality of first hole portions penetrating said substrate from the front surface to the back surface, the first hole portions for causing the second groove portions to communicate with the first groove portions placed on the front side of the second groove portions is formed,
   in a part of said substrate where ends of the third groove portions on the side of the second groove portions are placed, a plurality of second hole portions penetrating said substrate from the front surface to the back surface, the second hole portions for causing the third groove portions to communicate with the first groove portions placed on the front side of the third groove portions is formed,
   said first sealing plate is bonded to the front surface of said substrate so as to seal openings of the first groove portions on the front surface side,
   said second sealing plate is bonded to the back surface of said substrate so as to seal openings of the second groove portions on the back surface side and openings of the third groove portions on the back surface side,
   each of said passageways includes:
   a first inlet path into which the first fluid is introduced, the first inlet path being formed by a part of the first groove portion which is placed on the opposite side of the second hole portion with respect to the first hole portion;
   a second inlet path into which the second fluid is introduced, the second inlet path being formed by a part of the second groove portion where the first hole portion is not formed;
   a first junction portion formed by a part where the first hole portion causes the first groove portion and the second groove portion to communicate with each other, the first junction portion for joining the first fluid flowing through the first inlet path and the second fluid flowing through the second inlet path in the thickness direction of said substrate;
   a first joined fluid flow passage through which a fluid made by joining both the fluids in the first junction portion flows, the first joined fluid flow passage being formed by a part of the first groove portion placed between the first hole portion and the second hole portion;
   a branch portion formed by a part where the second hole portion causes the first groove portion and the third groove portion to communicate with each other, the branch portion for dividing the fluid flowing through the first joined fluid flow passage into two fluids in the thickness direction of said substrate;
   a first branch path through which one of the two fluids divided by the branch portion flows, the first branch path being formed by a part of the first groove portion placed on the opposite side of the first hole portion with respect to the second hole portion; and
   a second branch path through which the other of the two fluids divided by the branch portion flows, the second branch path being formed by a part of the third groove portion where the second hole portion is not formed, and
   a corresponding diameter of the first branch path and a corresponding diameter of the second branch path in each of said passageways are smaller than a corresponding diameter of the first joined fluid flow passage in the passageway.

2. The flow passage structure according to claim 1, wherein the sum of a cross-sectional area of the first branch path perpendicular to the longitudinal direction of the first branch path and a cross-sectional area of the second branch path perpendicular to the longitudinal direction of the second branch path in each of said passageways is not less than a cross-sectional area of the first joined fluid flow passage perpendicular to the longitudinal direction of the first joined fluid flow passage in the passageway.

3. The flow passage structure according to claim 1, wherein in a part of said substrate where ends of the third groove portions on the opposite side to the second groove portions are placed, a plurality of third hole portions penetrating said substrate from the front surface to the back surface, the third hole portions for causing the third groove portions to communicate with the first groove portions placed on the front side of the third groove portions is formed, and
each of said passageways includes:
a second junction portion formed by a part where the third hole portion causes the first groove portion and the third groove portion to communicate with each other, the second junction portion for joining the fluid flowing through the first branch path of the passageway and the fluid flowing through the second branch path of the passageway in the thickness direction of said substrate; and a second joined fluid flow passage through which a fluid made by joining the fluids in the second junction portion flows, the second joined fluid flow passage being formed by a part of the first groove portion placed on the opposite side of the second hole portion with respect to the third hole portion.

4. The flow passage structure according to claim 1, wherein a ratio D1/W1 between a depth D1 of each of the first branch paths in the thickness direction of said substrate and a width W1 of the first branch path in the direction parallel to the front surface of said substrate and in the direction perpendicular to the longitudinal direction of the first branch path is less than 0.5.

5. The flow passage structure according to claim 1, wherein a ratio D2/W2 between a depth D2 of each of the second branch paths in the thickness direction of said substrate and a width W2 of the second branch path in the direction parallel to the back surface of said substrate and in the direction perpendicular to the longitudinal direction of the second branch path is less than 0.5.

* * * * *